United States Patent
Lei et al.

(10) Patent No.: US 10,693,487 B1
(45) Date of Patent: Jun. 23, 2020

(54) SUCCESSIVE APPROXIMATION REGISTER ANALOG-TO-DIGITAL CONVERTER AND OPERATION METHOD THEREOF

(71) Applicant: REALTEK SEMICONDUCTOR CORPORATION, Hsinchu (TW)

(72) Inventors: Liang-Huan Lei, Kaohsiung (TW); Shih-Hsiung Huang, Miaoli County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/574,742

(22) Filed: Sep. 18, 2019

(30) Foreign Application Priority Data

Dec. 12, 2018 (TW) .............................. 107144861 A

(51) Int. Cl.
H03M 1/46 (2006.01)

(52) U.S. Cl.
CPC ........... *H03M 1/462* (2013.01); *H03M 1/466* (2013.01)

(58) Field of Classification Search
CPC .............................. H03M 1/466; H03M 1/462
USPC .................................................. 341/130–175
See application file for complete search history.

(56) References Cited

U.S. PATENT DOCUMENTS

| | | | | |
|---|---|---|---|---|
| 5,581,252 A * | 12/1996 | Thomas | ................ | H03M 1/466 341/144 |
| 5,675,340 A | 10/1997 | Hester et al. | | |
| 7,026,975 B1 * | 4/2006 | Steward | ................ | H03M 1/462 341/155 |
| 7,439,898 B1 * | 10/2008 | Nittala | .................. | H03M 1/462 341/155 |
| 8,421,658 B1 * | 4/2013 | Yau | ..................... | H03M 1/1004 341/118 |
| 8,477,058 B2 * | 7/2013 | Chang | ................... | H03M 1/462 341/141 |
| 9,148,166 B2 | 9/2015 | Narayan et al. | | |
| 9,287,891 B1 * | 3/2016 | Lee | ..................... | H03M 1/0641 |
| 9,774,345 B1 * | 9/2017 | Yoshioka | ............. | H03M 1/466 |
| 10,084,467 B1 * | 9/2018 | Chang | ................. | H03M 1/1295 |
| 10,200,847 B2 * | 2/2019 | Kim | ...................... | H04W 4/023 |

(Continued)

OTHER PUBLICATIONS

Zhu, Yan et al., A 10-bit 100-MS/s reference-free SAR ADC in 90 nm CMOS. IEEE Journal of Solid-State Circuits. vol. 45, Issue: 6, Jun. 2010. 1111-1121. 10.1109/JSSC.2010.2048498.

(Continued)

*Primary Examiner* — Lam T Mai
(74) *Attorney, Agent, or Firm* — WPAT, PC

(57) ABSTRACT

A successive approximation register (SAR) analog-to-digital converter (ADC) and a method of operating the SAR ADC are provided. The SAR ADC converts an analog input signal into a digital code and includes a switch-capacitor digital-to-analog converter (DAC), and the switch-capacitor DAC includes multiple capacitors. The method includes the steps of: switching terminal voltage(s) of at least one target capacitor among the capacitors according to a data in a sampling phase; sampling the analog input signal in the sampling phase; switching the terminal voltage(s) of the at least one target capacitor after the sampling phase; comparing the outputs of the switch-capacitor DAC to obtain multiple comparison results that constitute the digital code; and switching the terminal voltages of a part of the capacitors according to the comparison results.

12 Claims, 8 Drawing Sheets

(56) References Cited

U.S. PATENT DOCUMENTS

| | | | | |
|---|---|---|---|---|
| 10,218,376 | B1* | 2/2019 | Collins | H03M 1/66 |
| 10,333,543 | B1* | 6/2019 | Hurrell | H03M 1/462 |
| 2003/0123646 | A1* | 7/2003 | Srinivasan | H03M 1/0697 379/399.01 |
| 2011/0304492 | A1* | 12/2011 | Mandal | H03M 1/06 341/150 |
| 2011/0304493 | A1* | 12/2011 | Mitikiri | H03M 1/462 341/150 |
| 2013/0076546 | A1* | 3/2013 | Wan | H03M 1/1033 341/120 |
| 2013/0093609 | A1* | 4/2013 | Chang | H03M 1/462 341/110 |
| 2018/0083647 | A1* | 3/2018 | Yoshioka | H03M 1/462 |
| 2020/0091925 | A1* | 3/2020 | Lin | H03M 1/1245 |
| 2020/0091926 | A1* | 3/2020 | Wu | H03M 1/466 |

OTHER PUBLICATIONS

Y. Hu et al. "A 0.6V 6.4fJ/conversion-step 10-bit 150MS/s subranging SAR ADC in 40nm CMOS," 2014 IEEE Asian Solid-State Circuits Conference (A-SSCC), KaoHsiung, 2014, pp. 81-84. doi: 10.1109/ASSCC.2014.7008865.

Y. Lin, "A 9-bit 150-MS/s 1.53-mW subranged SAR ADC in 90-nm CMOS," 2010 Symposium on VLSI Circuits, Honolulu, HI, 2010, pp. 243-244. doi: 10.1109/VLSIC.2010.5560246.

V. Hariprasath et al., "Merged capacitor switching based SAR ADC with highest switching energy-efficiency," in Electronics Letters, vol. 46, No. 9, pp. 620-621, Apr. 29, 2010. doi: 10.1049/el.2010.0706.

C. Liu et al., "A 10-bit 50-MS/s SAR ADC With a Monotonic Capacitor Switching Procedure," in IEEE Journal of Solid-State Circuits, vol. 45, No. 4, pp. 731-740, Apr. 2010. doi: 10.1109/JSSC.2010.2042254.

Taiwan Intellectual Property Office, Office Action letter of counterpart TW application of application No. 107144861 dated Mar. 28, 2019. English summary on p. 1.

OA letter of the counterpart TW application (appl. No. 107144861) dated Feb. 19, 2020. Summary of the OA letter: Claims 1, 5, 6 and 10 are rejected under Taiwan Patent Law Article 33(2) as containing two or more inventions.

OA letter of the counterpart TW application (appl. No. 107144861) dated Sep. 24, 2019. Summary of the OA letter: Claims 1-10 are anticipated by reference 1(U.S. Pat. No. 9,148,166 B2).

* cited by examiner

SUCCESSIVE APPROXIMATION REGISTER ANALOG-TO-DIGITAL CONVERTER AND OPERATION METHOD THEREOF

BACKGROUND

1. Field of the Disclosure

The present disclosure generally relates to a successive approximation register (SAR) analog-to-digital converter (ADC), and, more particularly, to a SAR ADC that employs a switch-capacitor digital-to-analog converter (DAC).

2. Description of Related Art

In the following description, two ends of a capacitor are defined as a top plate and a bottom plate, respectively; the top plate refers to the end coupled to the comparator or amplifier, whereas the bottom plate refers to the end not coupled to the comparator or amplifier. Such definition is made only for the ease of discussion and not necessarily related to the "top" and "bottom" in the actual circuit.

A SAR ADC usually includes a comparator and a switch-capacitor digital-to-analog converter (DAC). FIG. 1 shows the comparator 105 and the internal circuit of the conventional switch-capacitor DAC 110. The switch-capacitor DAC 110 includes two capacitor arrays, each of which contains n capacitors (C1 to Cn or C1' to Cn') and n switches (SW1 to SWn or SW1' to SWn') (n is a positive integer). The switch SWk (or SWk') switches the terminal voltage of the bottom plate of the capacitor Ck (or Ck') according to the control signal GK (or #Gk) (k is an integer and $1 \leq k \leq n$). The capacitors C1 and C1' correspond to the most significant bit (MSB), and the capacitors Cn and Cn' correspond to the least significant bit (LSB), which implies that the capacitances decrease from the capacitors C1 and C1' toward the capacitors Cn and Cn' (e.g., decreasing in a binary progression). A capacitor pair (i.e., the capacitors Ck and Ck') includes two capacitors having substantially the same capacitance value. The control signal #Gk is the inverted signal of the control signal Gk. In other words, when the switch SWk is switched to the reference voltage Vref1, the switch SWk' is switched to the reference voltage Vref2; and when the switch SWk is switched to the reference voltage Vref2, the switch SWk' is switched to the reference voltage Vref1. FIG. 1 also shows that the analog input signal Vi is a differential signal which is composed of signals Vip and Vin, and the switches SWip and SWin are utilized to sample the analog input signal Vi.

During the comparison and switching operation of the SAR ADC, the disturbances on the reference voltage Vref1 or the reference voltage Vref2 cause an error at the positive input terminal and the negative input terminal of the comparator 105, and the amount or magnitude of this error is related to the switching states of the switches SW1 to SWn and SW1' to SWn', which means that the amount or magnitude of this error is related to the digital code outputted by the SAR ADC. For more details about the cause of the error and the calculation of the error amount/magnitude, please refer to the U.S. Pat. No. 9,800,255. This error has negative impacts on the performance of the SAR ADC (e.g., leading to extremely large differential nonlinearity (DNL)). Furthermore, because the switches SWk and SWk' are usually each implemented by an inverter that includes a P-type Metal-Oxide-Semiconductor Field-Effect Transistor (MOSFET) (hereinafter referred to as PMOS) and an N-type MOSFET (hereinafter referred to as NMOS), and the equivalent impedance of the PMOS often does not match that of the NMOS, the impedance values seen by the positive and negative input terminals of the comparator 105 are related to the digital code outputted by the SAR ADC. Such impedance mismatch causes errors to the SAR ADC or leads to poor signal-to-noise and distortion ratio (SNDR). For more details about impedance matching, please refer to the U.S. Patent Publication No: US 2019-0068179 A1.

SUMMARY

In view of the issues of the prior art, an object of the present disclosure is to provide successive approximation register (SAR) analog-to-digital converters (ADCs) and the methods of operating the SAR ADCs, so as to improve the performance and accuracy of the SAR ADCs.

A SAR ADC is provided. The SAR ADC operates in a sampling phase or a comparison and switching phase to convert an analog input signal into a digital code. The SAR ADC includes a switch-capacitor digital-to-analog converter (DAC), a comparator, a successive approximating register (SAR) and a control circuit. The switch-capacitor DAC includes multiple capacitors and configured to sample the analog input signal in the sampling phase. The comparator is coupled to the switch-capacitor DAC and configured to compare the outputs of the switch-capacitor DAC in the comparison and switching phase to generate multiple comparison results. The SAR is coupled to the comparator and configured to store the comparison results. The digital code is made up of the comparison results. The control circuit is coupled to the SAR and configured to switch the terminal voltages of a part of the capacitors according to the comparison results in the comparison and switching phase, and to switch the terminal voltage(s) of at least one target capacitor among the capacitors according to a data in the sampling phase.

A method of operating a SAR ADC is also provided. The SAR ADC is configured to convert an analog input signal into a digital code and includes a switch-capacitor DAC formed by multiple capacitors. The method includes the following steps: switching the terminal voltage(s) of at least one target capacitor among the capacitors according to a data in the sampling phase; sampling the analog input signal in the sampling phase; switching the terminal voltage(s) of the at least one target capacitor after the sampling phase; comparing the outputs of the switch-capacitor DAC to obtain multiple comparison results, the digital code being made up of the comparison results; and switching the terminal voltages of a part of the capacitors according to the comparison results.

By predicting at least one bit of the digital code and switching the switch-capacitor DAC according to the predicted bit in the sampling phase, the present disclosure decreases degree of impedance mismatch between two terminals of the comparator and makes amount of error less dependent on the digital code. Compared with the conventional technology, the SAR ADCs and the operation methods of the present disclosure can improve impedance matching and reduce the amount of error.

These and other objectives of the present disclosure no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes successive approximation register (SAR) analog-to-digital converters (ADCs) and methods of operating the SAR ADCs. On account of that some or all elements of the SAR ADCs could be known, the detail of such elements is omitted herein provided that such detail has little to do with the features of this disclosure, and that this omission nowhere dissatisfies the specification and enablement requirements. A person having ordinary skill in the art can choose components or steps equivalent to those described in this specification to carry out the present disclosure, which means that the scope of this disclosure is not limited to the embodiments in the specification.

Figure 1:
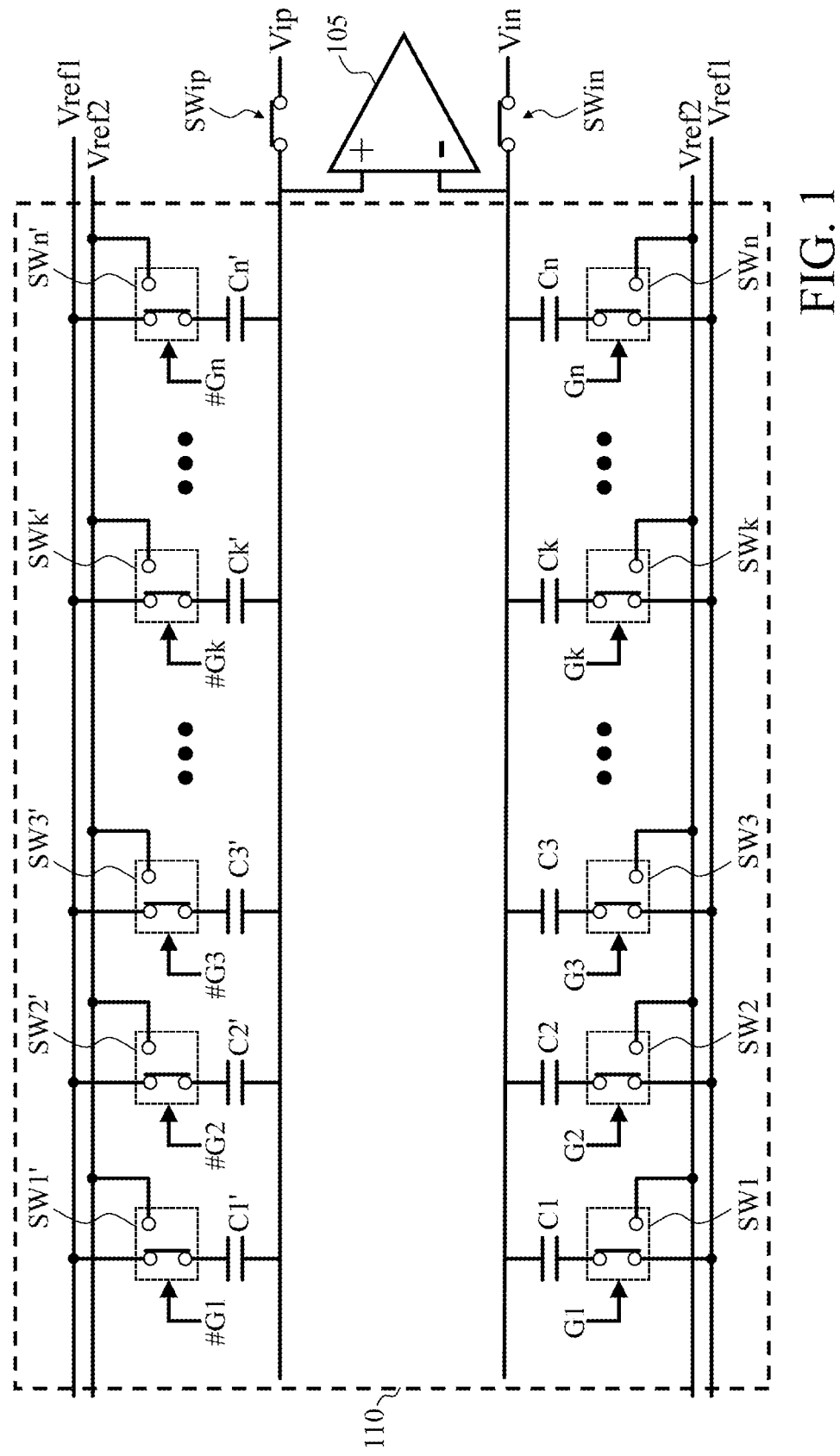
FIG. 1 illustrates the comparator and the internal circuit of the conventional switch-capacitor digital-to-analog converter (DAC).
Figure 2:
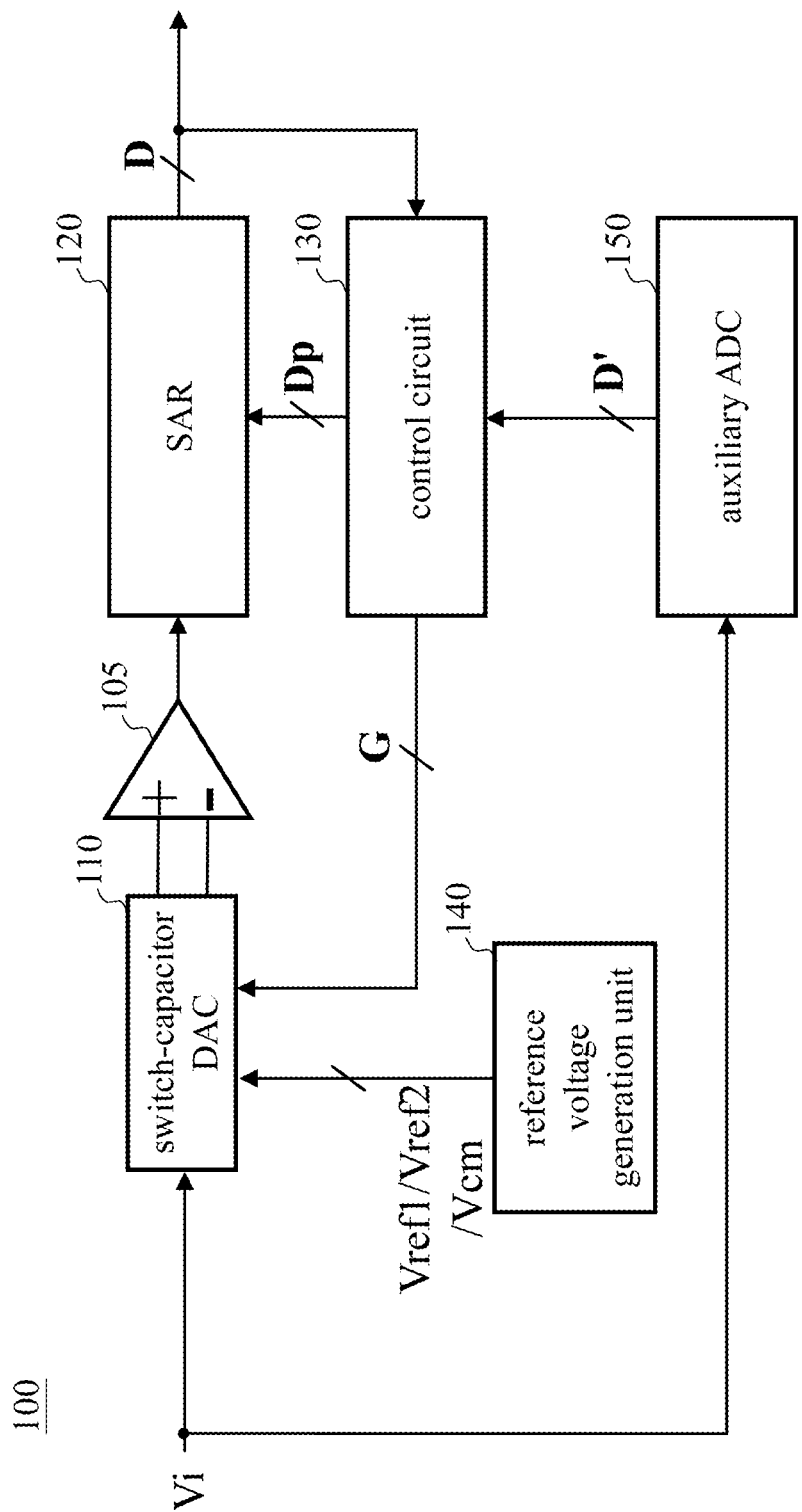
FIG. 2 illustrates a functional block diagram of a successive approximation register (SAR) analog-to-digital converter (ADC) according to an embodiment of the present disclosure.
Figure 3:
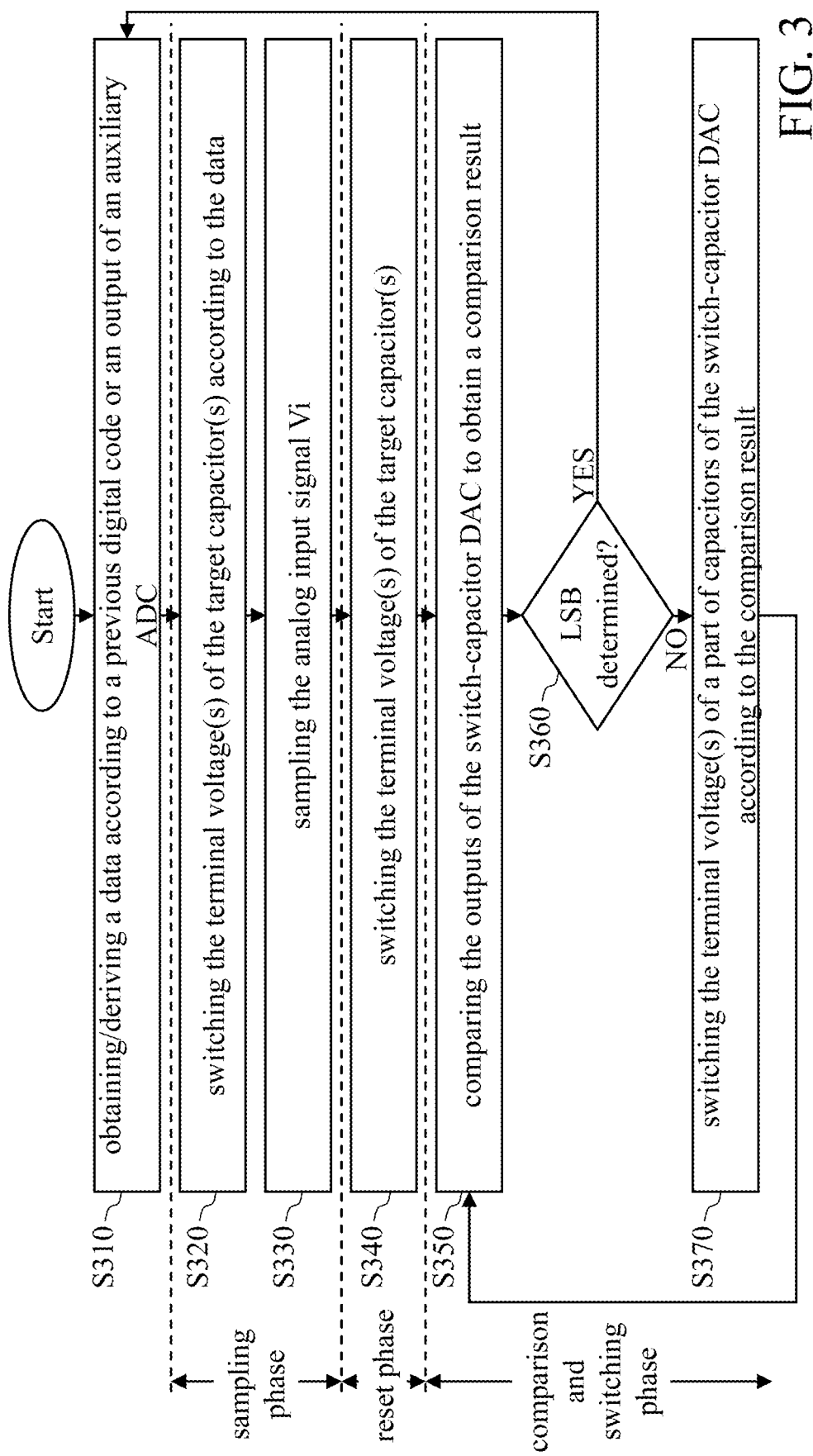
FIG. 3 illustrates a flow chart of a method of operating a SAR ADC according to an embodiment of the present disclosure.

FIG. 2 is a functional block diagram of a SAR ADC according to an embodiment of the present disclosure, and FIG. 3 is a flow chart of a method of operating the SAR ADC according to an embodiment of the present disclosure. The SAR ADC 100 includes a comparator 105, a switch-capacitor digital-to-analog converter (DAC) 110, a SAR 120, a control circuit 130, a reference voltage generation unit 140, and an auxiliary ADC 150. Based on the system clock, the SAR ADC 100 repeatedly operates in order in the following phases: the sampling phase, the reset phase, and the comparison and switching phase. The auxiliary ADC 150 converts the analog input signal Vi into the digital code D', and a data Dp can be derived from the digital code D' by the control circuit 130 (step S310). For example, the auxiliary ADC 150 can be a sub-range ADC, and the number of bits of the digital code D' is less than the number of bits of the digital code D. In some embodiments, the digital code D' corresponds to the first x MSBs of the digital code D (x is a positive integer), and the data Dp may be identical to the digital code D' or a portion of the bits of the digital code D'. In some embodiments, the data Dp contains the MSB of the digital code D'. The control circuit 130 can be a logic circuit formed by multiple logic gates and is configured to write the data Dp into the SAR 120. The control circuit 130 controls the switches of the switch-capacitor DAC 110 through the control signal G which includes G1 to Gn and #G1 to #Gn. The reference voltage generation unit 140 provides the reference voltage Vref1 and the reference voltage Vref2.

Figure 4:
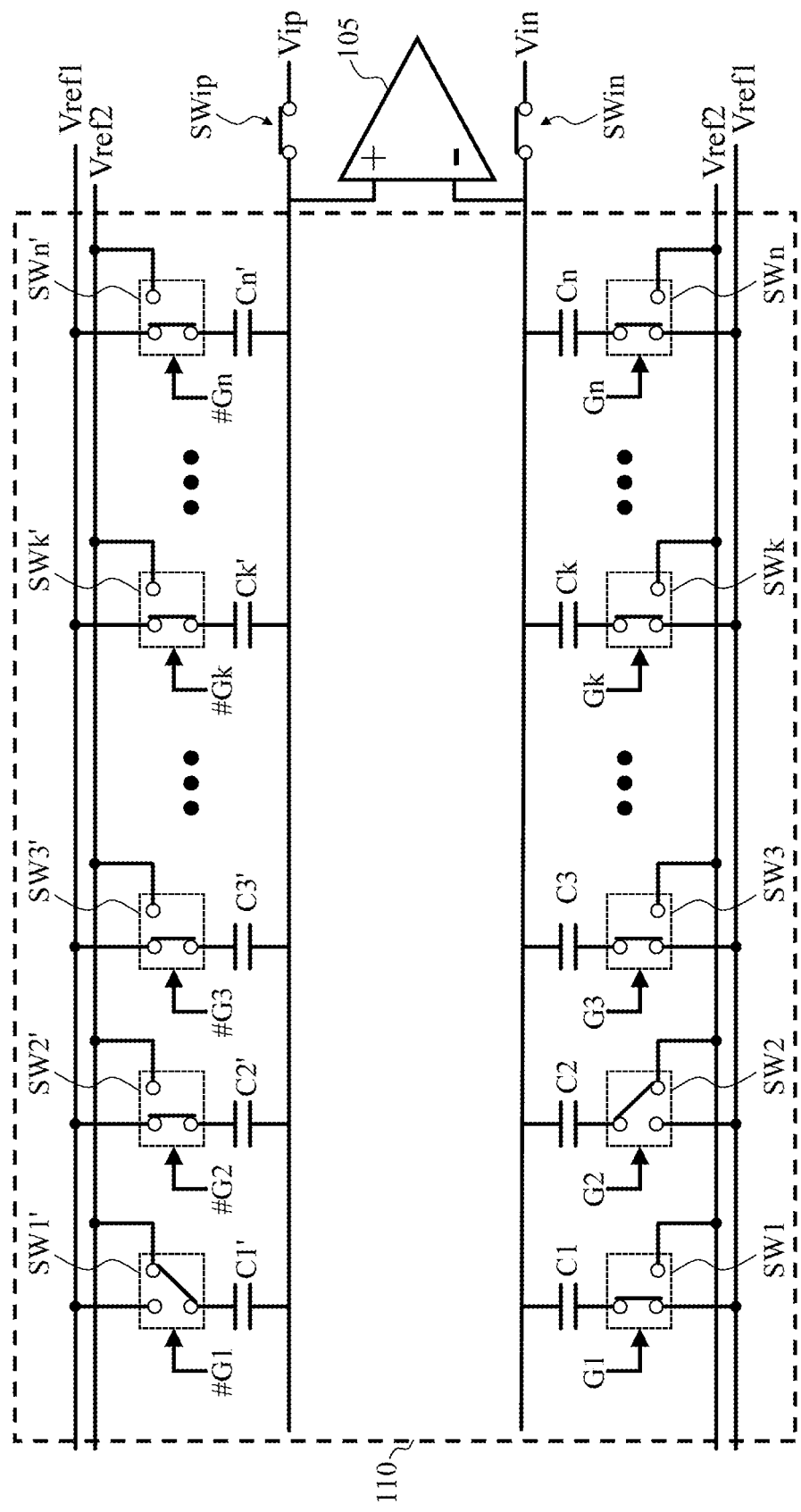
FIG. 4 illustrates an example of the switching state of the switch-capacitor DAC in the sampling phase.

In the next step S320, the control circuit 130 controls the terminal voltage(s) of the target capacitor(s) according to the data Dp in the sampling phase. FIG. 4 shows an example switching state of the switch-capacitor DAC 110 in the sampling phase. If, for example, the content of the data Dp is $01_2$, the control circuit 130 accordingly switches the terminal voltages of the target capacitors C1, C1, C2, and C2', so that the bottom plates of the target capacitors C1, C1, C2, and C2' are coupled to the reference voltages Vref1, Vref2, Vref2, and Vref1, respectively. In this example, Vref1 is greater than Vref2. In some embodiments, Vref1 can be the voltage source of the system or the chip, and Vref2 can be the ground voltage. Table 1 shows the terminal voltages of the capacitors C1, C1, C2, and C2' for a two-bit data Dp.

TABLE 1

| Dp | terminal voltages of the bottom plates of the capacitors C1, C1', C2, and C2' |
|----|---|
| 00 | Vref1/Vref2/Vref1/Vref2 |
| 01 | Vref1/Vref2/Vref2/Vref1 |
| 10 | Vref2/Vref1/Vref1/Vref2 |
| 11 | Vref2/Vref1/Vref2/Vref1 |

In addition to the target capacitors C1, C1, C2 and C2', the bottom plates of the other capacitors in FIG. 4 are coupled to the default voltage in the sampling phase, and the default voltage may be Vref1 or Vref2. In the example circuit of FIG. 4, the default voltage is Vref1. Next, the control circuit 130 controls the switch-capacitor DAC 110 to sample the analog input signal Vi with the state as shown in FIG. 4 by controlling the switches SWip and SWin to be turned on (step S330).

In some embodiments, steps S320 and S330 can be performed at the same time. For example, when the switches SWip and SWin are being turned on (step S330), the terminal voltage(s) of the target capacitor(s) (e.g., the target capacitors C1, C1, C2, and C2') are being switched at the same time according to the data Dp. In some embodiments, step S330 can be performed prior to step S320. For example, after the switches SWip and SWin are turned on, the terminal voltage(s) of the target capacitor(s) (e.g., the target capacitors C1, C1, C2, and C2') are switched according to the data Dp.

Figure 5:
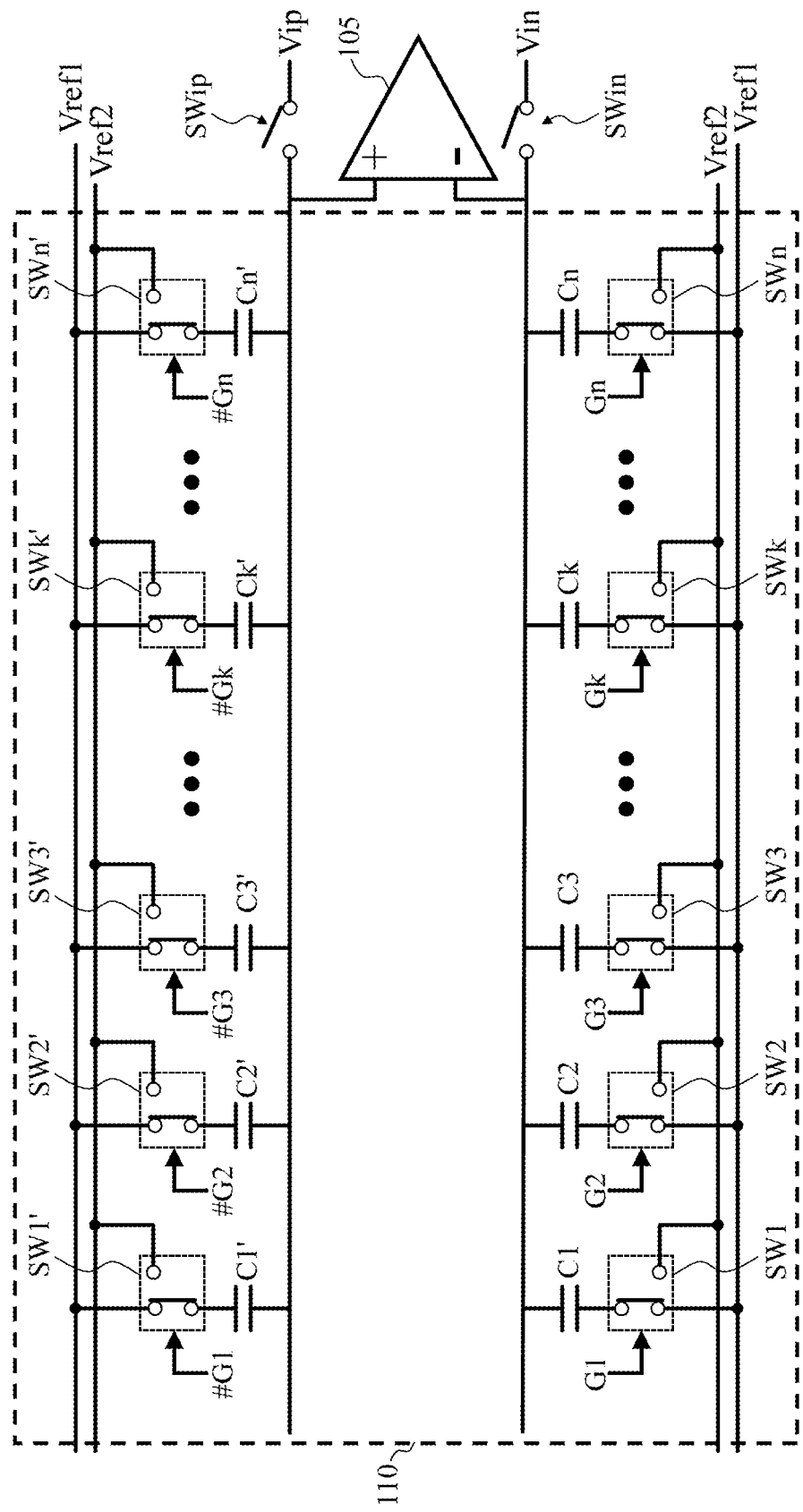
FIG. 5 illustrates an example of the switching state of the switch-capacitor DAC in the comparison and switching phase.

After the sampling phase ends (the switches SWip and SWin become turned-off), the SAR ADC 100 enters the reset phase in which the control circuit 130 switches the terminal voltage(s) of the target capacitor(s) (step S340) to cause the bottom plate(s) of all target capacitor(s) to be coupled to the default voltage (as shown in FIG. 5). Note that in step S340, the control circuit 130 controls the switches SWip and SWin to be turned off before switching the voltage(s) of the bottom plate(s) of the target capacitor(s).

After the reset phase ends, the SAR ADC 100 enters the comparison and switching phase, and the comparator 105 compares output of the switch-capacitor DAC 110, which are the voltages of the top plates of the two capacitor arrays, in this phase to generate a comparison result (step S350). The comparison result is one bit of the digital code D and is stored in the SAR 120. If the comparison result corresponds to the LSB of the digital code D (YES branch of step S360, meaning that the digital code D has just been determined), the flow returns to step S310 to proceed to generate the next digital code D. If, on the other hand, the result of step S360 is NO, the control circuit 130 switches the terminal voltage(s) of a part of the capacitors of the switch-capacitor DAC 110 by referring to the comparison result (equivalent to referring to the digital code D) in the comparison and switching phase (step S370), and the part of the capacitors does not include the target capacitor(s). Please note that when performing step S370, the control circuit 130 switches the terminal voltage of the bottom plate of only one capacitor of a capacitor pair. For example, the capacitor pair includes capacitors Ck and Ck', and, in step S370, the control circuit 130 changes the terminal voltage of the bottom plate of either Ck or Ck' from Vref1 to Vref2 or from Vref2 to Vref1. After step S370 is completed, the charges on the capacitors of the switch-capacitor DAC 110 are redistributed, and the comparator 105 proceeds to generate the next comparison result (i.e., determining the next bit of the current digital code D) according to the outputs of the switch-capacitor DAC 110 in the comparison and switching phase (step S350).

Observe that after the auxiliary ADC outputs the digital code D', the first m (m is the number of bits of the data Dp) bit(s) of the digital code D is/are determined (i.e., after being written into the SAR 120 by the control circuit 130, the data Dp is directly served as the MSB of the current digital code D). As a result, in the subsequent comparison and switching phase, the SAR ADC 100 only needs to determine the remaining bits of the digital code D. In other words, the voltages of the bottom plates of the target capacitors remain unchanged in the comparison and switching phase.

Figure 6:
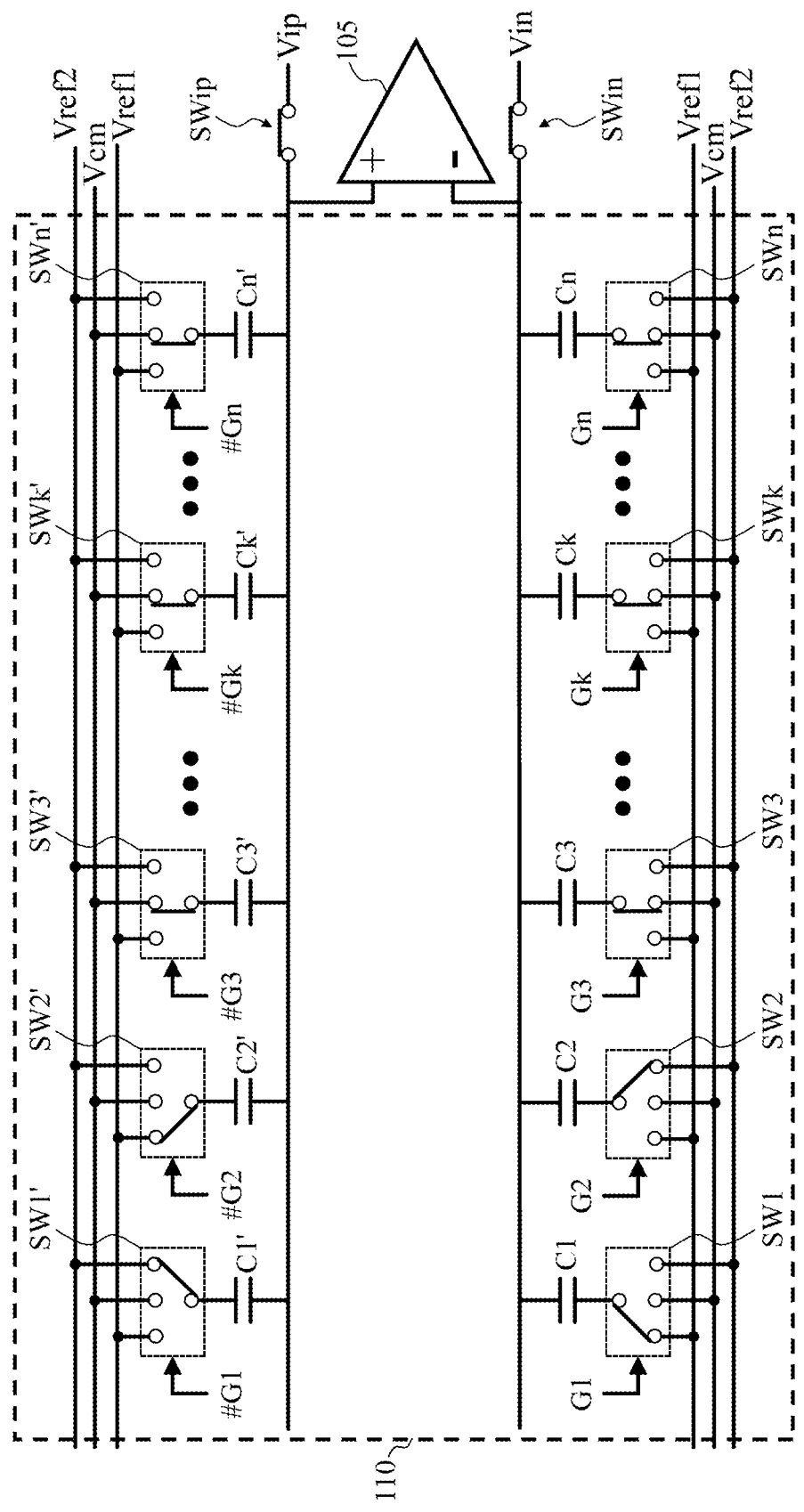
FIG. 6 illustrates another example of the switching state of the switch-capacitor DAC in the sampling phase.

FIG. 6 shows another example of the switching state of the switch-capacitor DAC 110 in the sampling phase. Assuming that Vref1 is greater than Vref2 (the reference voltage Vcm is a common mode voltage of Vref1 and Vref2 and may also be generated by the reference voltage generation unit 140) and that the content of the data Dp is also $01_2$, the control circuit 130 switches the terminal voltages of the target capacitors C1, C C2, and C2' according to the data Dp, so that the bottom plates of the target capacitors C1, C1, C2, and C2' are coupled to the reference voltages Vref1, Vref2, Vref2, and Vref1, respectively. Table 2 shows the terminal voltages of the capacitors C1, C1, C2, and C2' for the two-bit data Dp.

TABLE 2

| Dp | terminal voltages of the bottom plates of the capacitors C1, C1', C2, and C2' |
|---|---|
| 00 | Vref1/Vref2/Vref1/Vref2 |
| 01 | Vref1/Vref2/Vref2/Vref1 |
| 10 | Vref2/Vref1/Vref1/Vref2 |
| 11 | Vref2/Vref1/Vref2/Vref1 |

Figure 7:
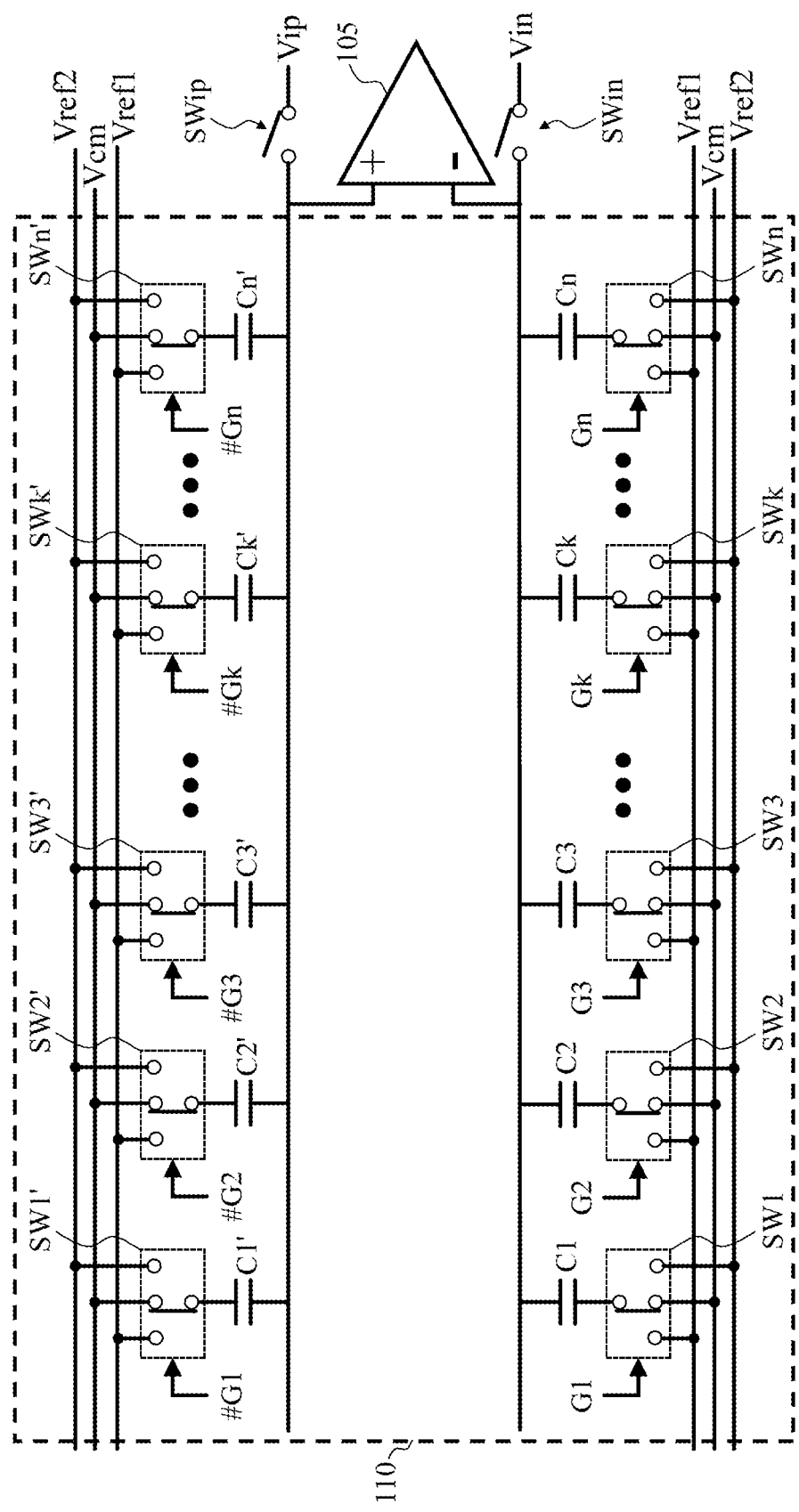
FIG. 7 illustrates another example of the switching state of the switch-capacitor DAC in the comparison and switching phase.

In addition to the target capacitors C1, C C2 and C2', the bottom plates of the other capacitors in FIG. 6 are coupled to the default voltage in the sampling phase, and the default voltage in the example circuit of FIG. 6 is the reference voltage Vcm. Similarly, in step S330, the control circuit 130 controls the switch-capacitor DAC 110 to sample the analog input signal Vi with the state as shown in FIG. 6 by controlling the switches SWip and SWin to be turned on. After the sampling phase ends (the switches SWip and SWin become turned-off), the SAR ADC 100 enters the reset phase in which the control circuit 130 switches the terminal voltage(s) of the target capacitor(s) (step S340) to cause the bottom plates of all target capacitors to be coupled to the default voltage (as shown in FIG. 7). Note that the control circuit 130 controls the switches SWip and SWin to be turned off before switching the voltage(s) of the bottom plate(s) of the target capacitor(s). In the example circuit of FIG. 7, when performing step S370, the control circuit 130 couples the bottom plate of one capacitor of a capacitor pair to one of Vref1 and Vref2 and couples the bottom plate of the other capacitor of the capacitor pair to the other of Vref1 and Vref2.

Even though the above examples are illustrated using the two-bit data Dp, there is no limitation to the number of bits of the data Dp. In some embodiments, the data Dp may have only one bit, and this bit may correspond to the MSB of the digital code D.

Figure 8:
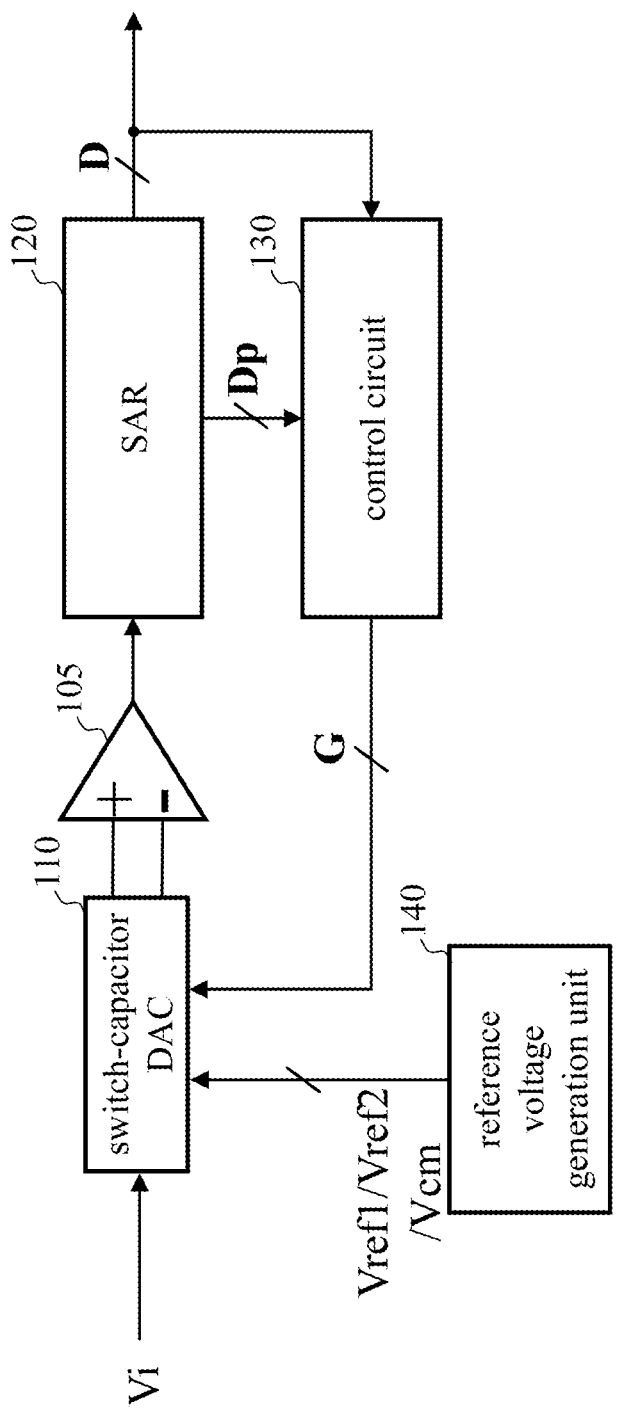
FIG. 8 illustrates a functional block diagram of a SAR ADC according to another embodiment of the present disclosure.

FIG. 8 shows a functional block diagram of a SAR ADC according to another embodiment of the present disclosure. In this embodiment, in step S310, the control circuit 130 obtains the data Dp from a previous digital code that is generated by the SAR ADC 100. In other words, in step S310, the control circuit 130 retrieves the data Dp from the SAR 120. The previous digital code is immediately followed by the current digital code. Specifically, if the SAR ADC 100 chronologically generates the digital codes D1, D2, D3, . . . , then D1 is the previous digital code of D2, D2 is the previous digital code of D3, and so on. For the flow of FIG. 3, if the SAR ADC 100 determines the LSB of the digital code D2 in step S350, the previous digital code that is referred to in step S310 of the next round in which the digital code D3 is determined would be the digital code D2. Similarly, the data Dp can be the previous digital code or some bits of the previous digital code. In some embodiments, the data Dp contains the MSB of the previous digital code. For the embodiment illustrated in FIG. 8, details of steps S320 to S370 are the same as the foregoing descriptions and thus omitted for brevity.

In the embodiment of FIG. 8, the first m (m is the number of bits of the data Dp) bit(s) of the current digital code D is/are taken from the first m bit(s) of the previous digital code, and the data Dp can be directly used as the most significant bit(s) of the current digital code D. In other words, in the embodiment of FIG. 8, the first m bit(s) of the current digital code D is/are identical to the first m bit(s) of the previous digital code.

Step S310 of the present disclosure can be regarded as a step of predicting a portion of the bits of the digital code D. Accordingly, to conduct sampling, the control circuit 130 adjusts in the sampling phase the circuit configuration of the switch-capacitor DAC 110 according to the prediction result (i.e., the data obtained in step S310) (step S320) and, after sampling is completed, the control circuit 130 resets the circuit configuration of the switch-capacitor DAC 110 (step S340). In this way, the voltage(s) of the bottom plate(s) of the target capacitor(s) become(s) independent of the current digital code D in the comparison and switching phase. In other words, the bottom plates of a pair of target capacitors are coupled to the same electric potential (i.e., the default voltage) in the comparison and switching phase. As a result, this disclosure can improve impedance matching between the positive input terminal and the negative input terminal of the comparator 105 so that the error amount/magnitude between the positive input terminal and the negative input terminal is reduced. In addition, compared with the conventional technology that simply digitizes the current analog signal, in this disclosure, an auxiliary ADC is utilized to output a digital code, and necessary processes are performed on the input signals in advance by feedforwarding the digital code to the target capacitor(s) to add/subtract analog signals corresponding to the digital code to/from the current analog signals in the sampling phase.

Since a person having ordinary skill in the art can appreciate the implementation detail and the modification thereto of the present method embodiment through the disclosure of the device embodiment, repeated and redundant description is thus omitted. Please note that there is no step sequence limitation for the method embodiments as long as the execution of each step is applicable. Furthermore, the shape, size, and ratio of any element and the step sequence of any flow chart in the disclosed figures are exemplary for understanding, not for limiting the scope of this disclosure.

The aforementioned descriptions represent merely the preferred embodiments of this disclosure, without any intention to limit the scope of this disclosure thereto. Various equivalent changes, alterations, or modifications based on the claims of this disclosure are all consequently viewed as being embraced by the scope of this disclosure.

What is claimed is:

1. A successive approximation register (SAR) analog-to-digital converter (ADC) operating in a sampling phase or in a comparison and switching phase to convert an analog input signal into a digital code, comprising:
    a switch-capacitor digital-to-analog converter (DAC) comprising a plurality of capacitors, and configured to sample the analog input signal in the sampling phase;
    a comparator, coupled to the switch-capacitor DAC, and configured to compare outputs of the switch-capacitor DAC in the comparison and switching phase to generate a plurality of comparison results;
    a successive approximating register (SAR), coupled to the comparator, and configured to store the comparison results, wherein the digital code is made up of the comparison results; and
    a control circuit, coupled to the SAR, and configured to switch terminal voltages of a part of the capacitors according to the comparison results in the comparison and switching phase, and to switch terminal voltage(s) of at least one target capacitor among the capacitors according to a data in the sampling phase.

2. The SAR ADC of claim 1, wherein the data is used as at least one bit of the digital code.

3. The SAR ADC of claim 2, wherein the at least one bit is a most significant bit.

4. The SAR ADC of claim 1, wherein the digital code is a first digital code, and the SAR ADC further comprises:
    an auxiliary ADC coupled to the control circuit and configured to convert the analog input signal into a second digital code;
    wherein the data comprises a portion of the second digital code.

5. The SAR ADC of claim 1, wherein the SAR ADC generates a previous digital code before generating the digital code, and the data comprises a portion of the previous digital code.

6. The SAR ADC of claim 1, wherein the SAR ADC further operates in a reset phase, the reset phase is after the sampling phase and before the comparison and switching phase, and the control circuit is further configured to switch the terminal voltage(s) of the at least one target capacitor in the reset phase to control all of the capacitors to be coupled to a default voltage.

7. A method of operating a successive approximation register (SAR) analog-to-digital converter (ADC), wherein the SAR ADC is configured to convert an analog input signal into a digital code and comprises a switch-capacitor digital-to-analog converter (DAC) formed by a plurality of capacitors, and the method comprises:
    switching terminal voltage(s) of at least one target capacitor among the capacitors according to a data in the sampling phase;
    sampling the analog input signal in the sampling phase;
    switching the terminal voltage(s) of the at least one target capacitor after the sampling phase;
    comparing outputs of the switch-capacitor DAC to obtain a plurality of comparison results, wherein the digital code is made up of the comparison results; and
    switching terminal voltages of a part of the capacitors according to the comparison results.

8. The method of claim 7, wherein the data is used as at least one bit of the digital code.

9. The method of claim 8, wherein the at least one bit is a most significant bit.

10. The method of claim 7, wherein the digital code is a first digital code, and the SAR ADC further comprises an auxiliary ADC configured to convert the analog input signal into a second digital code, the method further comprising:
    deriving the data from the second digital code, wherein the data comprises a portion of the second digital code.

11. The method of claim 7, wherein the SAR ADC generates a previous digital code before generating the digital code, and the data comprises a portion of the previous digital code.

12. The method of claim 7, wherein the step of switching the terminal voltage(s) of the at least one target capacitor after the sampling phase controls all of the capacitors to be coupled to a default voltage.

* * * * *